United States Patent
Genrikh et al.

(10) Patent No.: US 7,491,987 B2
(45) Date of Patent: Feb. 17, 2009

(54) JUNCTION FIELD EFFECT THIN FILM TRANSISTOR

(75) Inventors: Stefanovich Genrikh, Yongin-si (KR); Choong-Rae Cho, Yongin-si (KR); Eun-Hong Lee, Yongin-si (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 6 days.

(21) Appl. No.: 11/705,108

(22) Filed: Feb. 12, 2007

(65) Prior Publication Data
US 2008/0001184 A1 Jan. 3, 2008

(30) Foreign Application Priority Data
Jun. 28, 2006 (KR) .................. 10-2006-0058893

(51) Int. Cl.
*H01L 29/80* (2006.01)
(52) U.S. Cl. .............. 257/256; 257/134; 257/272; 257/256; 257/504; 257/E29.057; 257/E29.059
(58) Field of Classification Search ............... 257/256, 257/504, E29.057, E29.059, 134, 272
See application file for complete search history.

(56) References Cited

U.S. PATENT DOCUMENTS

| | | | |
|---|---|---|---|
| 5,357,127 A | * | 10/1994 | Park et al. .......... 257/189 |
| 5,459,343 A | * | 10/1995 | Seymour et al. ............ 257/275 |
| 2004/0023432 A1 | * | 2/2004 | Haga .................... 438/104 |
| 2004/0155846 A1 | * | 8/2004 | Hoffman et al. ............ 345/87 |
| 2006/0194500 A1 | * | 8/2006 | Ishii ..................... 445/24 |
| 2006/0226443 A1 | * | 10/2006 | Ryu et al. ............... 257/192 |

FOREIGN PATENT DOCUMENTS

JP 09191017 A * 7/1997

OTHER PUBLICATIONS

Caputo et al., Low Pinch-Off Voltage Amorphous Silicon Junction Field-Effect transistor: Experiment and Simulation, IEEE Trans. Elcn. Device, vol. 50, No. 6, p. 1559-1561, Jun. 2003.*

* cited by examiner

*Primary Examiner*—Eugene Lee
*Assistant Examiner*—Peniel M Gumedzoe
(74) *Attorney, Agent, or Firm*—Harness, Dickey & Pierce, PLC

(57) ABSTRACT

Example embodiments are directed to a junction field effect thin film transistor (JFETFT) including a first electrode formed on a substrate, a first conductive first gate semiconductor pattern formed on the first gate electrode, a second conductive semiconductor channel layer formed on the substrate and the first conductive first gate semiconductor pattern, and source and drain electrodes formed on the second conductive semiconductor pattern and located at both sides of the first conductive gate semiconductor pattern. The JFETFT may further include a first conductive second gate semiconductor pattern formed on a portion of the second conductive semiconductor channel layer between the source electrode and the drain electrode, and a second gate electrode formed on the first conductive second gate semiconductor pattern.

15 Claims, 2 Drawing Sheets

JUNCTION FIELD EFFECT THIN FILM TRANSISTOR

PRIORITY STATEMENT

This application claims the benefit of Korean Patent Application No. 10-2006-0058893, filed on Jun. 28, 2006 in the Korean Intellectual Property Office, the disclosure of which is incorporated herein in its entirety by reference.

BACKGROUND

1. Field

Example embodiments relate to a thin film transistor (TFT), and more particularly to a junction field effect TFT.

2. Description of the Related Art

A thin film transistor (TFT) may be a switching device used, for example, in liquid crystal display devices, in organic electroluminescent (EL) display devices, or in memory devices, and may generally have a metal oxide semiconductor field effect transistor (MOSFET) structure as illustrated in FIG. 1.

Referring to FIG. 1, a conventional TFT may include a predetermined or given substrate 10, for example, silicon, on which a gate electrode 20 and a gate insulating layer 25 may be sequentially formed. A semiconductor layer 30 may be formed on the gate insulating layer 25 and on the substrate 10 as a channel layer, and a source electrode 40a and a drain electrode 40b may be formed on both sides of the upper surface of the semiconductor layer 30.

The gate insulating layer 25 may be formed of an oxide layer, usually through a heat process, and the semiconductor layer 30 may be formed of a metal oxide, for example, indium zinc oxide (IZO).

In the conventional TFT, a channel, that is, an electrical connection path of the source electrode 40a and the drain electrode 40b may be formed in the semiconductor layer 30 adjacent to the gate insulating layer 25 by applying a voltage greater than the threshold voltage Vt to the gate electrode 20. In other words, a voltage that may be applied to the gate electrode 20 determines whether the channel may be formed or not, and thereby switching may be determined by the channel.

However, when a portion of the semiconductor layer 30 that may be adjacent to the gate insulating layer 25 may be used as a channel in the conventional TFT, many defects may be present at an interface (portion A) of the gate insulating layer 25 and the semiconductor layer 30, which may result in a decrease in the mobility of carriers.

Thus, the conventional TFT having a portion of the semiconductor layer 30 adjacent to the gate insulating layer 25 as a channel, as illustrated in FIG. 1, may be limited in increasing operation speed and improving performance of the conventional TFT.

Also, in the conventional TFT, the gate insulating layer 25 may have to be charged to turn-on the TFT, thereby decreasing the operation speed and increasing power consumption. Moreover, in order to obtain a high quality gate insulating layer 25, a high temperature process may be required, which may deteriorate the properties of the conventional TFT, and may limit the available types of substrates that may be used. For example, a plastic substrate may not be used in a TFT manufacturing process that requires a high temperature process.

SUMMARY OF THE INVENTION

Example embodiments are directed to a junction field effect thin film transistor (JFETFT) that can solve a decrease in the mobility of carriers of the conventional TFT.

According to example embodiments, a JFETFT may include a first gate electrode formed on a substrate, a first conductive type first gate semiconductor pattern formed on the first gate electrode, a second conductive type semiconductor channel layer formed on the substrate and the first conductive type first gate semiconductor pattern, and source and drain electrodes formed on the second conductive type semiconductor pattern and located at both sides of the first conductive type gate semiconductor pattern.

According to example embodiments, the JFETFT may further include a first conductive type second gate semiconductor pattern formed on a portion of the second conductive type semiconductor channel layer between the source electrode and the drain electrode, and a second gate electrode formed on the first conductive type second gate semiconductor pattern. The second gate electrode may be electrically connected to the first gate electrode.

The substrate may be formed of a material selected from the group including silicon, quartz, glass and plastic.

The first and second gate electrodes may be formed of a metal oxide layer.

The first conductive type first gate semiconductor pattern and the second conductive type semiconductor channel layer may be transparent conductive oxide layers.

The first conductive type first gate semiconductor pattern may be a p-type semiconductor, and the second conductive type semiconductor channel layer may be an n-type semiconductor.

The first conductive type first gate semiconductor pattern may be formed of a material selected from the group including NiO, MgZnO, CuO, and $SrCu_2O_2$.

The second conductive type semiconductor channel layer may be formed of a material selected from the group including ZnO, $SnO_2$, IZO, and Ga—In—Zn—O.

The first gate electrode and the first conductive type first gate semiconductor pattern may be in ohmic contact with each other.

The second gate electrode and the first conductive type second gate semiconductor pattern may be in ohmic contact with each other.

BRIEF DESCRIPTION OF THE DRAWINGS

The above and other features and advantages of example embodiments will become more apparent by describing in detail example embodiments thereof with reference to the attached drawings in which.

DETAILED DESCRIPTION OF THE INVENTION

Figure 1:
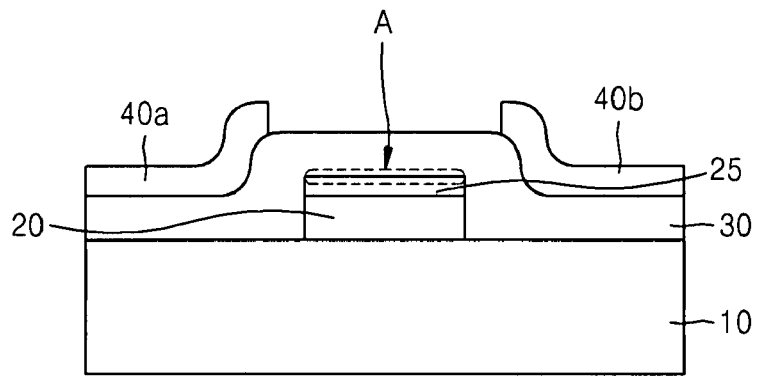
FIG. 1 illustrates a cross-sectional view of a conventional thin film transistor (TFT).

Embodiments will be described more fully with reference to the accompanying drawings, in which example embodiments are shown. In the drawings, the thicknesses of layers and regions may be exaggerated for clarity.

First, a technical principle will be described briefly. Example embodiments are directed to a junction field effect thin film transistor (JFETFT) which may have a p-n junction, and not a conventional metal oxide semiconductor (MOS) structure. For example, an n-type semiconductor may be used as a semiconductor layer for a channel, a p-type semiconductor may be used as a gate material, and the size of a depletion region generated from junction regions between the materials may be controlled to switch the thin film transistor (TFT) on and off. The channel may be formed inside the semiconductor layer, and not at the interface of the semiconductor layer, and thus the mobility of carriers may be improved as compared to a conventional TFT that may use an interface as a channel.

The JFETFT according to example embodiments may not require a gate insulating layer, and thus a decrease in operation speed and increase in consumption power due to the inclusion of the gate insulating layer may be fundamentally avoided. Associated problems caused by a high temperature process may also be avoided. Hereinafter, the JFETFT according to example embodiments will be described in detail with reference to FIGS. 2 and 3.

Figure 2:
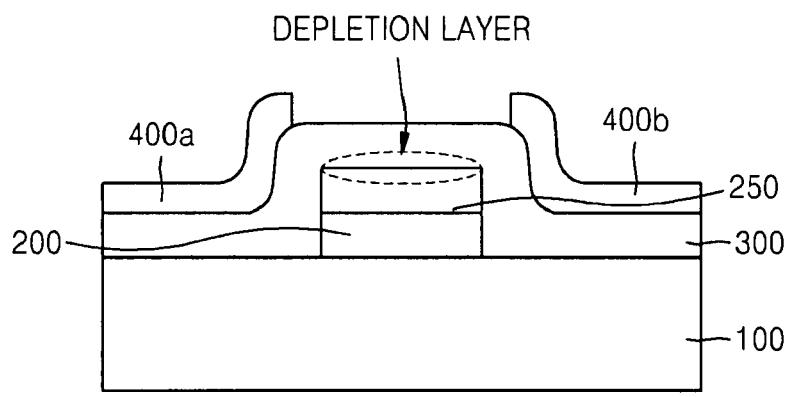
FIG. 2 illustrates a cross-sectional view of a junction field effect thin film transistor (JFETFT) according to example embodiments.

FIG. 2 illustrates a cross-sectional view of the JFETFT according to example embodiments. The JFETFT may include a gate electrode 200 formed on a substrate 100, a first conductive gate semiconductor pattern 250 formed on the gate electrode 200, a second conductive semiconductor channel layer 300 formed on the substrate 100 and covering the first conductive gate semiconductor pattern 250, and a source electrode 400a and a drain electrode 400b formed on the second conductive semiconductor pattern 300 and located at both sides of the first conductive gate semiconductor pattern 250.

The substrate 100 may be a Si substrate, a quartz substrate, a glass substrate or a plastic substrate.

The gate electrode 200 may be a noble metal oxide, for example, $IrO_2$, $RuO_2$, etc . . . , and a metal oxide, for example, $NiO_x$.

The first conductive gate semiconductor pattern 250 may be a p-type semiconductor including NiO, MgZnO, CuO, $SrCu_2O_2$ or an amorphous transparent conductive oxide (TCO).

The second conductive semiconductor channel layer 300 may be an n-type semiconductor including ZnO, $SnO_2$, indium zinc oxide (IZO), Ga—In—Zn—O, or an amorphous TCO.

The gate electrode 200 and the first conductive gate semiconductor pattern 250 may be in ohmic contact with each other.

Table 1 below shows selected properties of an oxide semiconductor that may be used in the present invention.

TABLE 1

| Kind | Electron affinity (eV) | Energy gap (eV) | Work function (eV) | Conductive type |
|---|---|---|---|---|
| ZnO | 4.20 | 3.30 | 4.25 | n |
| $SnO_2$ | 4.49 | 3.80 | 4.53 | n |
| IZO | 4.30 | 3.10~3.60 | 4.90~5.30 | n |
| NiO | 1.40 | 3.47 | 4.77 | p |
| MgZnO | — | 3.00~3.40 | — | p |
| CuO | 4.10 | 1.35 | 5.30 | p |
| $SrCu_2O_2$ | — | 3.30 | 5.00 | p |

In the JFETFT according to example embodiments as illustrated in FIG. 2, when a predetermined or given voltage is applied to the gate electrode 200, the source electrode 400a, and the drain electrode 400b (for example, when a negative voltage is applied to the gate electrode 200, and a first positive voltage is applied to the source electrode 400a, and a second positive voltage is applied to the drain electrode 400b), a depletion layer may be formed around the junction of the first conductive type gate semiconductor pattern 250 and the second conductive type semiconductor channel layer 300. The JFETFT may be switched on and off by controlling the size of the depletion layer.

That is, a channel may be formed inside and not at the interface of the second conductive semiconductor channel layer 300 in the JFETFT according to example embodiments, and thus the mobility of carriers may increase.

Also, as described above, since no gate insulating layer need be used in the JFETFT in example embodiments, problems, for example, a decrease in operation speed and increase in consumption power due the inclusion of a gate insulating layer, may be fundamentally avoided.

In addition, since a transparent semiconductor pattern may be formed of a metal oxide at lower temperature than a gate insulating layer requiring a high temperature process, the problems caused by the high temperature process may be avoided. Accordingly, a deterioration of the properties of a device due to the high temperature process may also be avoided. Therefore, a plastic substrate, which may have relatively lower resistance to heat, may be applied in the JFETFT according to example embodiments. Thus, a flexible, transparent, and reliable semiconductor device or JFETFT may be realized.

Figure 3:
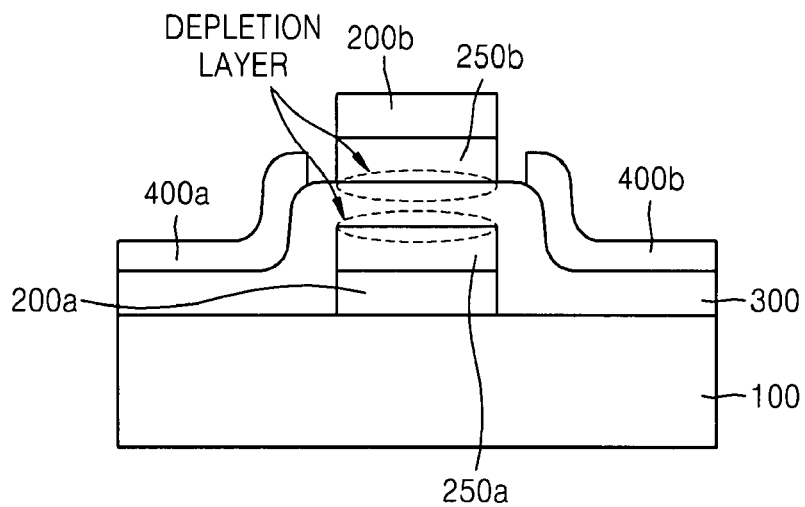
FIG. 3 illustrates a cross-sectional view of a JFETFT according to example embodiments.

FIG. 3 is a cross-sectional view of a JFETFT according to example embodiments. The JFETFT may include a first gate electrode 200a on a substrate 100, a first gate semiconductor pattern 250a formed on the first gate electrode 200a, a second conductive semiconductor channel layer 300 formed on the substrate 100 and covering the first conductive first gate semiconductor pattern 250a, and a source electrode 400a and a drain electrode 400b formed on the second conductive semiconductor channel layer 300 and located at both sides of the first conductive first gate semiconductor pattern 250a. The JFETFT may further include a first conductive second gate semiconductor pattern 250b formed on a portion of the second conductive semiconductor channel layer 300 between the source electrode 400a and the drain electrode 400b, and a second gate electrode 200b formed on the first conductive second gate semiconductor pattern 250b. Though not illustrated in FIG. 3, the second gate electrode 200b may be electrically connected to the first gate electrode 200a. The second electrode 200b and the first gate electrode 200a may be electrically connected by, for example, a formation of contact holes and/or wires. It should be apparent to those of ordinary skill in the art that the first and second gate electrodes 200a and 200b may also be formed in alternate shapes.

The JFETFT illustrated in FIG. 3 may be formed as the JFETFT of FIG. 2 in terms of materials, and may further include the first conductive second gate semiconductor pattern 250b and the second gate electrode 200b. The first conductive second gate semiconductor pattern 250b and the second gate electrode 200b may be formed of the same material as that of the first conductive first gate semiconductor pattern 250 and the first gate electrode 200 of the JFETFT of FIG. 2.

As in example embodiments according to the JFETFT of FIG. 3, a stack structure of a gate semiconductor pattern and a gate electrode may be formed in a pair parallel on both upper and lower sides of the semiconductor channel layer 300, which may form two depletion layers, and the TFT may be switched on and off by either or both depletion layers. Accordingly, the JFETFT of FIG. 3 may have a greater on/off control ability than the JFETFT of FIG. 2. In other words, a high on/off current ratio may be obtained by preventing leakage current in the JFETFT of FIG. 3.

Figure 4:
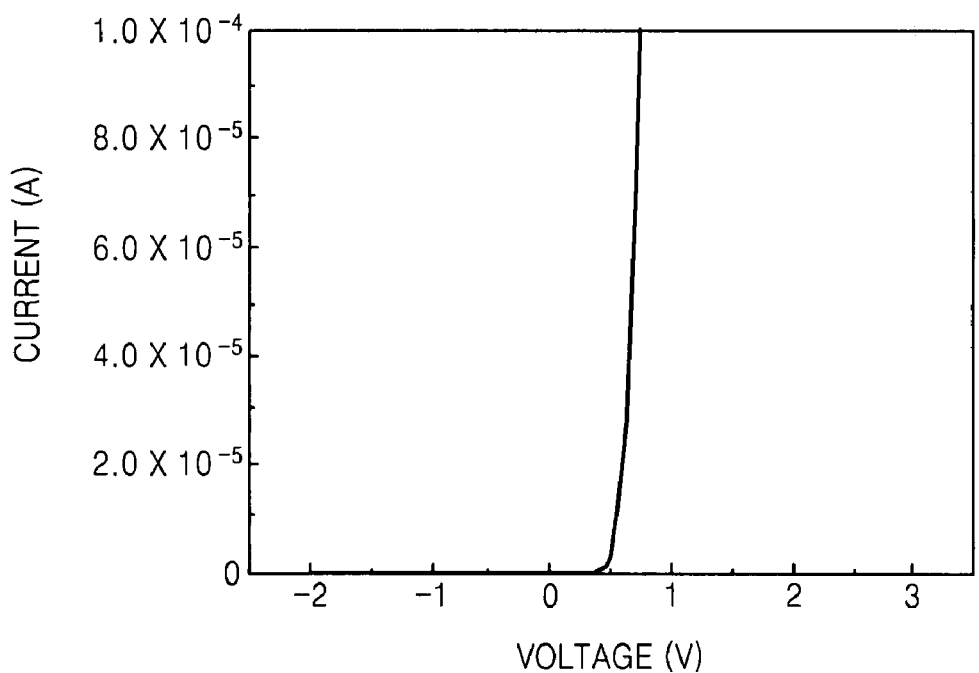
FIGS. 4 and 5 are graphs illustrating the rectifying characteristics of a p-n junction of oxide layers according to example embodiments.
Figure 5:
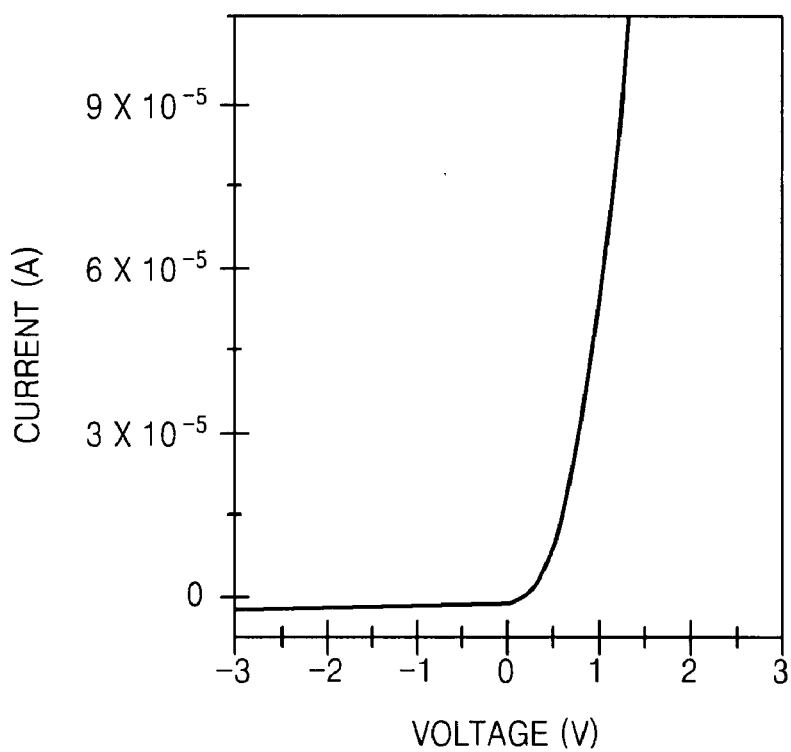

FIGS. 4 and 5 are graphs showing rectifying characteristics of p-n junctions that may be used in example embodiments. With respect to FIG. 4, IZO is used as a semiconductor channel layer and NiO is used as a gate semiconductor pattern. With respect to FIG. 5, ZnO is used as a semiconductor channel layer, and $SrCu_2O_2$ is used as a gate semiconductor pattern.

Table 2 below shows the calculation of the widths of the depletion layers according to the carrier concentration (Nd) and the applied gate voltage (Vg), and thus indicates that a fully depleted IZO channel may be realized at a relatively low carrier concentration (Nd) and at a relatively low gate voltage (Vg).

TABLE 2

| Conditions | Widths of depletion layers according to gate voltage (Vg) | | |
|---|---|---|---|
| | 0.3 V | −0.3 V | −1.0 V |
| $Nd = 10^{17}\,cm^{-3}$ | 140 nm | 280 nm | 386 nm |
| $Nd = 10^{19}\,cm^{-3}$ | 14 nm | 28 nm | 39 nm |

As described above, the p-n junction may be formed between the semiconductor layer for a channel and the gate materials. The size of the depletion layers of the p-n junction may be controlled to switch the thin film transistor (TFT) on and off. The channel may be formed inside and not at the interface of the semiconductor layer in the JFETFT according to example embodiments. Accordingly, the JFETFT may have greater carrier mobility than a conventional MOS type TFT, which may use the interface of the semiconductor layer as a channel.

Also, the JFETFT according to the present invention may not include a gate insulating layer, and thus problems, for example, a decrease in operation speed and increase in consumption power due to an inclusion of the gate insulating layer, as well as problems that may be caused by a high temperature process may be fundamentally avoided. For example, in example embodiments, a transparent conductive oxide layer may be used as a TFT material, and moreover, a plastic substrate may be used as a substrate. Thus the example embodiments may realize a flexible and transparent semiconductor device.

While the example embodiments herein have been particularly shown and described, it will be understood by those of ordinary skill in the art that various changes in form and details may be made. For example, the shape and position of a gate electrode, a gate semiconductor pattern, a source electrode, and a drain electrode of a JFETFT may vary. Thus, the spirit and scope should not be limited by the illustrative embodiments described above.

What is claimed is:

1. A junction field effect thin film transistor (JFETFT), comprising:
   a first gate electrode on a substrate;
   a first conductive type first gate semiconductor pattern on the first gate electrode;
   a second conductive type semiconductor channel layer on the substrate and the first conductive type first gate semiconductor pattern; and
   source and drain electrodes on the second conductive type semiconductor pattern, located at both sides of the first conductive type gate semiconductor pattern,
   wherein the first conductive type first gate semiconductor pattern is a transparent conductive oxide layer.

2. The JFETFT of claim 1, wherein the substrate is formed of a material selected from the group consisting of silicon, quartz, glass and plastic.

3. The JFETFT of claim 1, wherein the first gate electrode is made of a metal oxide layer.

4. The JFETFT of claim 1, wherein the second conductive type semiconductor channel layer is a transparent conductive oxide layer.

5. The JFETFT of claim 1, wherein the first conductive type first gate semiconductor pattern is a p-type semiconductor, and the second conductive type semiconductor channel layer is an n-type semiconductor.

6. The JFETFT of claim 1, wherein the first conductive type first gate semiconductor pattern is formed of a material selected from the group consisting of NiO, MgZnO, CuO, and $SrCu_2O_2$.

7. The JFETFT of claim 1, wherein the second conductive type semiconductor channel layer is formed of a material selected from the group consisting of ZnO, $SnO_2$, IZO, and Ga—In—Zn—O.

8. The JFETFT of claim 1, wherein the first gate electrode and the first conductive type first gate semiconductor pattern are in ohmic contact with each other.

9. The JFETFT of claim 1, further comprising: a first conductive type second gate semiconductor pattern on a portion of the second conductive type semiconductor channel layer between the source electrode and the drain electrode; and a second gate electrode on the first conductive type second gate semiconductor pattern.

10. The JFETFT of claim 9, wherein the second gate electrode is electrically connected to the first gate electrode.

11. The JFETFT of claim 9, wherein the second gate electrode is formed of a metal oxide layer.

12. The JFETFT of claim 9, wherein the first conductive type second gate semiconductor pattern and the second conductive type semiconductor channel layer are transparent conductive oxide layer.

13. The JFETFT of claim 9, wherein the first conductive type second gate semiconductor pattern is a p-type semiconductor, and the second conductive type channel layer is an n-type semiconductor.

14. The JFETFT of claim 9, wherein the first conductive type second gate semiconductor pattern is formed of a material selected from the group consisting of NiO, MgZnO, CuO, and $SrCu_2O_2$.

15. The JFETFT of claim 9, wherein the second gate electrode and the first conductive type second gate semiconductor pattern are in ohmic contact with each other.

* * * * *